(12) United States Patent
Jeon

(10) Patent No.: US 6,661,829 B2
(45) Date of Patent: Dec. 9, 2003

(54) VERTICAL CAVITY SURFACE EMITTING LASER

(76) Inventor: Heon-su Jeon, 1148 Sanbon-dong, Myohyang Apt. 938-501, Kunpo-si, Kyungki-do (KR)

( * ) Notice: Subject to any disclaimer, the term of this patent is extended or adjusted under 35 U.S.C. 154(b) by 0 days.

(21) Appl. No.: 10/160,654

(22) Filed: Jun. 3, 2002

(65) Prior Publication Data

US 2002/0181536 A1 Dec. 5, 2002

(30) Foreign Application Priority Data

Jun. 2, 2001 (KR) ........................................ 2001-31019
May 18, 2002 (KR) ........................................ 2002-27597

(51) Int. Cl.[7] ................................................ H01S 3/08
(52) U.S. Cl. ............................................ 372/96; 372/99
(58) Field of Search ........................ 372/98, 101, 103, 372/45, 50, 46, 96

(56) References Cited

U.S. PATENT DOCUMENTS

| | | | | |
|---|---|---|---|---|
| 5,432,812 A | * | 7/1995 | Kurobe et al. | 372/99 |
| 6,026,111 A | * | 2/2000 | Jiang et al. | 372/96 |
| 6,178,035 B1 | | 1/2001 | Eda et al. | |
| 6,343,090 B1 | * | 1/2002 | Yoo et al. | 372/96 |
| 2003/0012231 A1 | * | 1/2003 | Tayebati et al. | 372/20 |

FOREIGN PATENT DOCUMENTS

| | | | | |
|---|---|---|---|---|
| EP | 0 101 368 | | 2/1984 | |
| EP | 001195863 A2 | * | 10/2000 | H01S/5/183 |
| EP | 001207599a2 | * | 10/2000 | H01S/5/183 |
| EP | 1 195 863 | | 4/2002 | |
| EP | 1 207 599 | | 5/2002 | |
| FR | 2 768 566 | | 3/1999 | |
| WO | WO 97/40558 | * | 4/1996 | H01S/3/085 |
| WO | WO 97/40558 | | 11/1997 | |

OTHER PUBLICATIONS

Nikolajeff, Fredrik et al. "Spatial–mode Control of Vertical–Cavity Lasers with Micromirrors Fabricated and Replicated in Semiconductor Materials," Applied Optics, vol. 38, No. 14. (Washington, DC, May 1999) pp. 3030–3038.

Strezelecka, E.M. et al. "Monolithic Integration of Vertical–Cavity Laser Diodes with Refractive GaAs Microlenses," Electronics Letters, vol. 31, No. 9. (IEE, Apr. 1995) pp. 724–725.

Si–Hyun Park et al., "Microlensed vertical–cavity surface–emitting laser for stable single fundamental mode operation", Applied Physics Letters, vol. 80, No. 2, pp. 183–185 (Jan. 2002).

* cited by examiner

Primary Examiner—Paul Ip
Assistant Examiner—Tuan Nguyen
(74) Attorney, Agent, or Firm—St. Onge Steward Johnston & Reens LLC

(57) ABSTRACT

Provided is a vertical cavity surface emitting laser (VCSEL) including a feedback member which feeds a portion of light externally emitted from a resonator for generating and amplifying a laser beam, back into the resonator by reflecting the same and acts as a concave mirror for the resonator. The VCSEL operates predominantly in the single fundamental transverse mode, emitting a laser output having a peak intensity at its center. The VCSEL can be manufactured by a simple process and provides excellent reproducibility.

17 Claims, 6 Drawing Sheets

VERTICAL CAVITY SURFACE EMITTING LASER

BACKGROUND OF THE INVENTION

1. Field of the Invention

The present invention relates to a vertical cavity surface emitting laser, and more particularly, to a vertical cavity surface emitting laser capable of operating predominantly in a single fundamental transverse mode.

2. Description of the Related Art

Vertical cavity surface emitting lasers (VCSELs) provide a higher coupling efficiency with an optical fiber due to the emission of a circular laser beam, and the ease of the manufacture of an array, and enable error detection and characteristics measurement in a wafer state, so they are emerging as a promising light source in optical communications and optical interconnections. In particular, index-guided VCSELs, in which an aperture through which current flows is confined by selective oxidation, have a very low threshold current and power consumption, high efficiency, and excellent linearity of current to light output. Therefore, the index-guided VCSELs can be applied to transceiver modules for local area communications and for optical interconnection between computers and digital displays, and some of which are under commercialization.

However, index-guided VCSELs have a greater difference in the index of refractivity between an oxidized portion and a non-oxidized portion so that they principally can operate in a plurality of traverse modes. Since the oxidized portion of the index-guided VCSEL provides a structure of current injection confinement, it is easy to inject the current into a circumference portion of an aperture surrounded by the oxidized region and thus higher order traverse modes tend to be oscillated at low output power. Undoubtedly, the operation efficiency of a single transverse mode can be increased to some extent by forming the aperture surrounded by the oxidized region to be smaller. In this case, resistance of the VCSEL excessively increases, and a cross-sectional area for the laser oscillation becomes small, thereby lowering the overall output power. As a result, it is difficult to apply the index-guided VCSEL to optical communications devices. For these reasons, a variety of approaches to suppress multiple transverse modes and improve the output power of the single transverse mode oscillation in the index-guided VCSEL have been suggested. Suggestions for the improvement of the single transverse mode oscillation output power include a method of etching an external portion of a laser beam output window using ion beams, a method of implanting ions while selective oxidation is performed, a method of forming a resonator with an active layer to be longer, etc. However, those methods suggested up to now have problems of complicated processes and poor reproducibility.

SUMMARY OF THE INVENTION

To solve the above-described problems, it is an object of the present invention to provide a vertical cavity surface emitting laser (VCSEL) capable of operating predominantly in a single fundamental transverse mode, which can be manufactured by a simple process and has excellent reproducibility.

To achieve the object of the present invention, there is provided a VCSEL comprising a feedback member which feeds a portion of light externally emitted from a resonator for generating and amplifying a laser beam, back into the resonator by reflecting the same.

Preferably, the feedback member acts as a concave mirror for the resonator. Preferably, the vertical cavity surface emitting laser is constructed of a material based on one selected from the group consisting of GaAs, GaSb, GaN, InP, and ZnSe. Preferably, the feedback member is formed of a semiconductor material which is transparent with respect to the wavelength of the laser oscillation and is capable of lattice matching with a material of the substrate or a material of a thin film structure on the substrate. Preferably, the feedback member is formed of a material selected from the group consisting of organic and inorganic materials which are transparent with respect to the wavelength of the laser oscillation.

It is preferable that the feedback member is positioned on the top of an upper distributed Bragg reflector and/or the bottom of the substrate. In this case, the feedback member positioned on the top of the upper distributed Bragg reflector has an effective radius of curvature ranging from approximately 200 $\mu$m to approximately 500 $\mu$m. Preferably, a gain area for the laser oscillation is increased for high-power oscillation of a fundamental transverse mode by increasing at least one of an aperture of laser oscillation, the effective diameter of the feedback member, and a radius of curvature of the feedback member. Preferably, at least one of the aperture of laser oscillation and the effective diameter of the feedback member is increased to weaken the diffraction power of oscillating light such that the feedback member feeds the portion of the light externally emitted from the resonator back into the resonator by reflecting the same and simultaneously acts as a lens for light proceeding to the outside from the resonator to make it into a converging beam, diverging beam, or parallel beam. Preferably, the laser oscillation is induced by current injection. In this case, the VCSEL further may comprise a current confinement structure which is formed by selective oxidation or ion implantation and confines flow of current. Alternatively, the laser oscillation may be induced by optical pumping of external light.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

Figure 1:
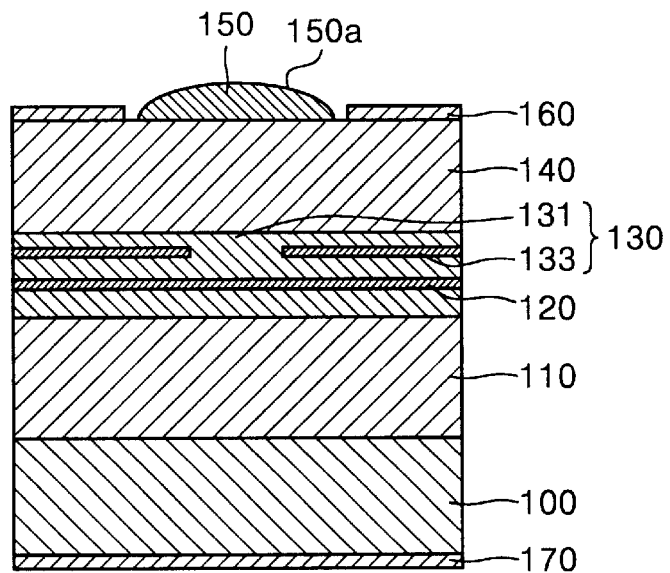
FIG. 1 is a schematic view of an embodiment of a vertical cavity surface emitting laser (VCSEL) according to the present invention.

A first embodiment of a vertical cavity surface emitting laser (VCSEL) according to the present invention is shown in FIG. 1. Referring to FIG. 1, the first embodiment of the VCSEL integrated with a feedback member according to the present invention includes a substrate 100, a lower electrode 170 formed underneath the substrate 100, a lower distributed Bragg reflector (DBR) 110, an active layer 120, a current confinement layer 130, and an upper DBR 140, which are sequentially formed on the substrate 100, a feedback member 150 formed on the upper DBR 140, and an upper electrode 160 formed on the upper DBR 140 to surround the feedback member 150.

The substrate 100 may be formed of a compound semiconductor material, for example, $n^+$-doped gallium arsenide (GaAs).

The lower DBR 110 and the upper DBR 140 form a resonator for inducing and amplifying emission of light in the active layer 120. The lower DBR 110 is doped with the same type, i.e., n-type, as the substrate 100. The upper DBR 140 is doped with an opposite type, i.e., p-type, to the substrate 100.

Each of the lower DBR 110 and the upper DBR 140 is formed by alternately stacking compound semiconductor materials having different refractive indices. Here, for a structure where a generated laser beam is emitted through the upper DBR 140, as shown in FIG. 1, the upper DBR 140 is formed to have a relatively lower reflectivity, and the lower DBR 110 is formed to have a relatively higher reflectivity than the upper DBR 110. The reflectivity of reflectors varies depending on the number of semiconductor compound layers deposited to form the same. Accordingly, by forming the upper DBR 140 with less material layers than used to form the lower DBR 110, the reflectivity of the upper DBR 140 can become lower than that of the lower reflector 110.

The upper and lower DBRs 140 and 110 induces a flow of electrons and holes by the current applied across the upper and lower electrodes 160 and 170, and the upper and lower DBRs 140 and 110 reflect repeatedly light generated in the active layer 120 such that only light in accordance with the resonance condition is emitted through the upper DBR 140.

The active layer 120, a region where light generated by energy transition due to the recombination of holes and electrons provided from the upper and lower DBRs 140 and 110, has a multiple quantum-well structure. It is preferable that the VCSEL according to the present invention further comprises the current confinement layer 130 above the active layer 120, which guides the current applied through the upper electrode 160 to flow across a central portion of the active layer 120. The current confinement layer 130 may be formed by depositing a pre-oxidative layer (not shown) on the active layer 120 and selectively oxidizing the pre-oxidative layer from the outer portion inwardly in an oxidization atmosphere. In this case, the current confinement layer 130 is formed of an oxidized region 133 and an aperture 131 surrounded by the oxidized region 133. The aperture 131 is a non-oxidized region that can transmit current and light.

In the VCSEL according to the present invention, instead of forming the current confinement layer 130 by selective oxidation, such a structure of current flow confinement may be formed by implantation of ions.

Figure 2:
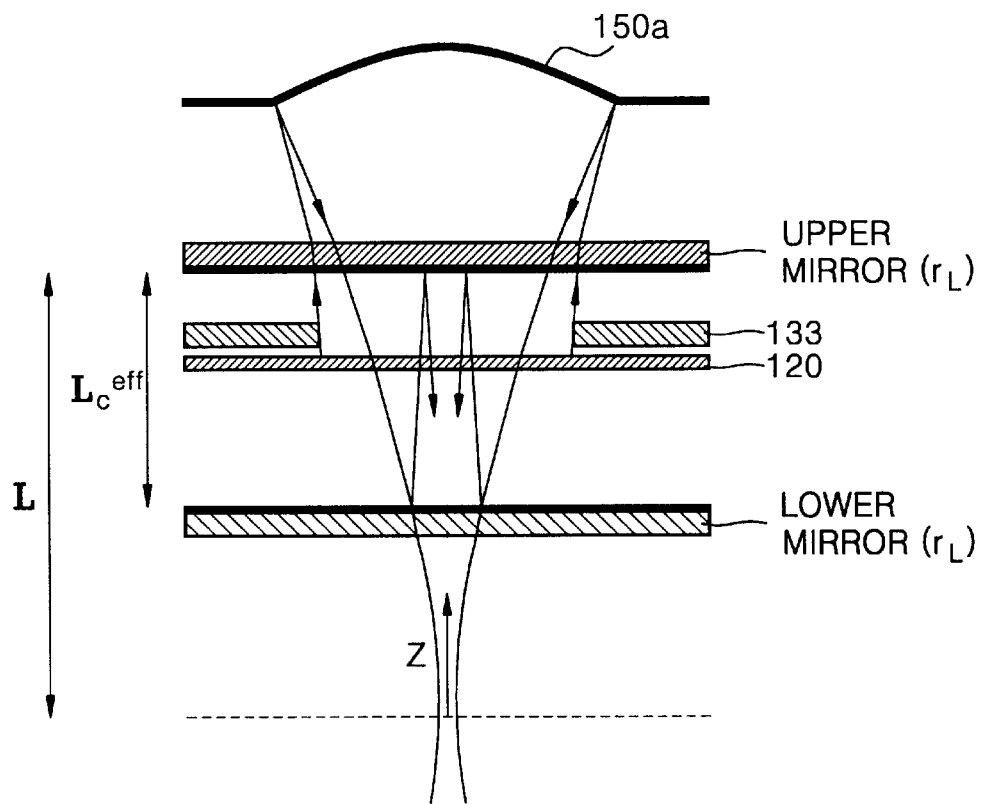
FIG. 2 illustrates the principle of emitting a laser beam of an improved single transverse mode in the VCSEL according to the present invention.

The feedback member 150 feeds a portion of a laser beam externally output from the resonator through the upper DBR 140 back into the resonator, as shown in FIG. 2. Referring to FIGS. 1 and 2, the feedback member 150 has a lens surface 150a having a convex lens structure and appears as a concave mirror when viewed from the resonator formed by the upper and lower DBRs 140 and 110.

In this case, a portion of the laser beam output from the resonator through the upper DBR 140 is reflected by the concave mirror and fed back into the resonator, as shown in FIG. 2. The laser beam re-entering the resonator travels along its path folded back and forth by reflection whenever it hits the upper and lower DBRs 140 and 110, i.e., upper and lower mirrors $r_U$ and $r_L$. At the same time, the laser beam fed back into the resonator goes forward and returns, repeatedly, within the resonator by the action of the concave mirror and gradually focused into a small light spot. The focal length, i.e., the position of a minimum beam waist (focal point), is determined by the radius of curvature of the concave mirror.

In an embodiment of the present invention, an effective radius of curvature of the lens surface 150 of the feedback member 150 acting as the concave mirror may be in a range of from about 200 $\mu$m to about 500 $\mu$m, more preferably, from about 250 $\mu$m to about 300 $\mu$m. Also, since the feedback member 150 is positioned close to a laser oscillation location (separated from the active layer 120 approximately by the thickness of the upper DBR 140 and some layers), the effective diameter of the feedback member 150 acting as the concave mirror can become very small. As an example, if the aperture 131 of the current confinement layer 130 has a size of 15 $\mu$m, the feedback member 150 may have an effective diameter of about 30 $\mu$m.

The feedback member 150 acting as the concave mirror, which feeds a portion of the output laser beam back into the resonator, as described above, may be formed on the upper DBR 140 using a semiconductor material capable of lattice matching with a material of the upper DBR 140 and having a relatively wide bandgap to the wavelength of the laser beam generated from the VCSEL according to the present invention so as not to absorb, but just transmit the laser beam emitted through the upper DBR 140.

For example, when a VCSEL according to the present invention is designed to emit a laser beam having a wavelength of 850 nm and the substrate 100 is formed of GaAs, the feedback member 150 may be formed of indium gallium phosphide (InGaP) capable of lattice matching with GaAs due to their similar lattice size. The composition ratio of In and Ga to lattice match with GaAs of the substrate 100 is about 49:51.

A VCSEL structure according to the present invention integrated with the feedback member 150 for single traverse mode oscillation may be based on, as well as GaAs described as an example above, for example, gallium antimonide (GaSb), gallium nitride (GaN), indium phosphide (InP), zinc selenide (ZnSe), etc. The feedback member 150 may be formed of a semiconductor material capable of being lattice matching with those materials of the substrate 100 or a material of a thin film structure on the substrate 100, for example, the upper DBR 140.

When the feedback member 150 is formed of a semiconductor material having a relatively wide bandgap to the wavelength of the laser beam oscillated by the VCSEL according to the present invention, the feedback member 150 may be manufactured as follows.

In particular, in the manufacturing process of a VCSEL according to the present invention, a semiconductor material layer for the feedback member 150 is deposited and etched to form a lens surface by a diffusion-limited wet-etching process. A variety of techniques as well as the diffusion-limited wet-etching process can be applied to form the feedback member 150 described above using a semiconductor material.

Suitable materials for the feedback member 150 are not limited to semiconductor materials. In other words, the feedback member 150 may be formed of a variety of materials, including organic materials, such as polymers, and inorganic material, such as silica, capable of transmitting, not absorbing, the wavelength of the laser beam oscillated from the VCSEL according to the preset invention. It is appreciated that the feedback member 150 can be formed of any materials by any manufacturing techniques as long as the original function of the feedback member 150 is ensured. For example, instead of forming the feedback member 150 by the deposition of a material layer for the feedback member 150 on the upper DBR 140 and the etching of the material layer to form a lens surface, the feedback member 150 may be formed as a separate member and then attached to the top of the upper DBR 140.

While the feedback member 150 has been described and illustrated in this embodiment as being applied to the VCSEL oscillating by the injection of current, the feedback member 150 can be applied to a VCSEL whose secondary oscillation is induced by optical pumping of another external laser beam. In other words, a VCSEL according to the present invention may be designed such that laser oscillations occur by external optical pumping.

Figure 3:
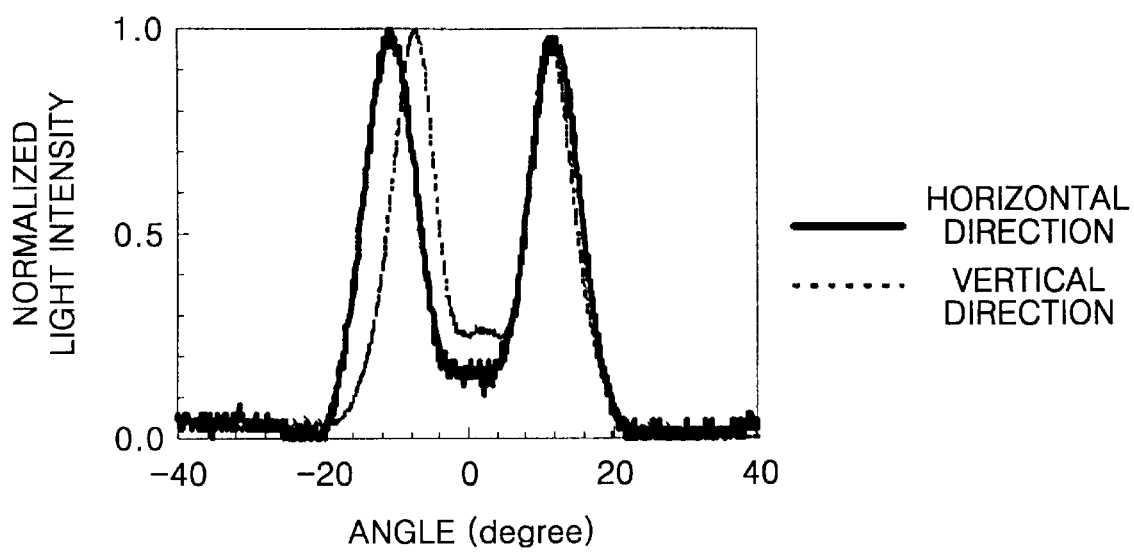
FIG. 3 shows a typical far-field pattern of a conventional VCSEL measured at an output power of 1.5 mW.
Figure 4:
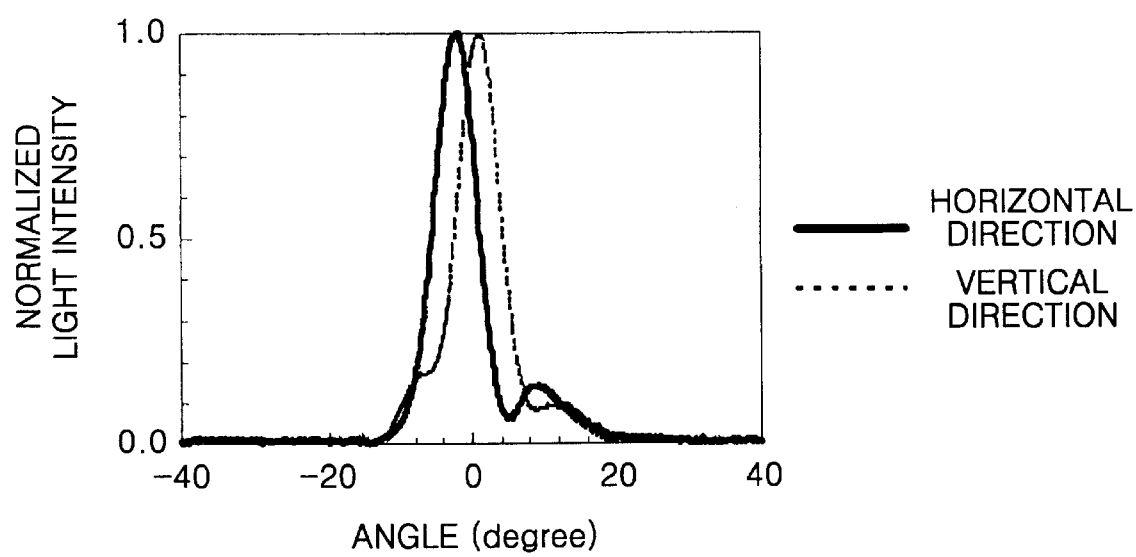
FIG. 4 shows a typical far-field pattern of the VCSEL according to the present invention measured at the same output power as applied to the conventional VCSEL of FIG. 3, in which the VCSEL according to the present invention has an aperture formed by selective oxidation to be equal in size to the conventional VCSEL.

In a VCSEL according to the present invention with the feedback member 150 acting as the concave mirror for the resonator described above, the single fundamental transverse mode output is markedly improved, as is apparent in FIGS. 3 and 4. FIG. 3 shows the far-field pattern of a conventional VCSEL measured at an output power of 1.5 mW. FIG. 4 shows the far-field pattern of a VCSEL according to the present invention measured at the same output power as applied to the conventional VCSEL of FIG. 3, where the aperture 131 of the VCSEL according to the present invention formed by selective oxidation has the same size as the aperture of the conventional VCSEL of FIG. 3. As is apparent from FIG. 4, the VCSEL according to the present invention shows a remarkably improved single fundamental transverse mode output having a Gaussian beam pattern, compared to the conventional VCSEL.

Therefore, a single fundamental transverse laser output power higher than conventional VCSELs can be obtained with the VCSEL according to the present invention.

The inventor has theoretically confirmed through model computations the predominant oscillation of the single fundamental transverse mode from the VCSEL according to the present invention, which has the feedback member 150 acting as a concave mirror for feeding a portion of the output beam back into the resonator.

A VCSEL has several transverse modes as a result of its structure. Due to the presence of the feedback member 150 in the present invention, the spot size of a feedback portion of the output laser beam in the respective transverse modes gradually decreases due to the optical focusing effect described above.

In the oxide-confined VCSEL structure having the current confinement layer 130 formed by selective oxidation, the transverse mode field profile is denoted as $\psi_m(\rho,\phi)$, and the feedback transverse mode field profile is denoted as $\psi'_m(\rho,\phi)$, where m is a mode index. The active layer 120 is expected to cumulatively experience the feedback transverse mode field profile $\psi'_m(\rho,\phi)$ as a result of multiple passes of the feedback laser beam. Accordingly, the feedback transverse mode field profile $\psi'_m(\rho,\phi)$ can be expressed by formula (1) below:

$$\psi'_m(\rho, \phi) = \sum_{n=1}^{\infty} \left( \frac{(r_L r_U)^{\frac{n-1}{2}}}{r_L^{n/2} r_U^{n/2-1}} \right) U(\rho, z_n) \psi_m(\rho, \phi) \tag{1}$$

In formula (1) above, n is an integer indicating the number of reflections in the resonator, $r_L$ and $r_U$ are the reflectivity of the lower and upper mirrors, respectively, as shown in FIG. 2, and $z_n$ denotes the effective position of the active region 120 along the propagation axis after the nth reflection and is expressed as $$z_n = L - \left(n - \frac{1}{2}\right) L_c^{\mathit{eff}},$$

where L is the distance from the upper mirror to the Gaussian beam waist of the feedback beam where the smallest Gaussian beam is positioned, and $L_c^{\mathit{eff}}$ is the effective resonator length. The origin of the z-axis is defined to be located at the minimum beam waist, i.e., the focal point of the concave mirror. In formula (1) above, $U(\rho, z_n)$ denotes the Gaussian beam amplitude function, which governs the optical focusing effect, where no phase factor is needed since the phase of $L_c^{\mathit{eff}}$ is a multiple of $2\pi$.

Figure 5:
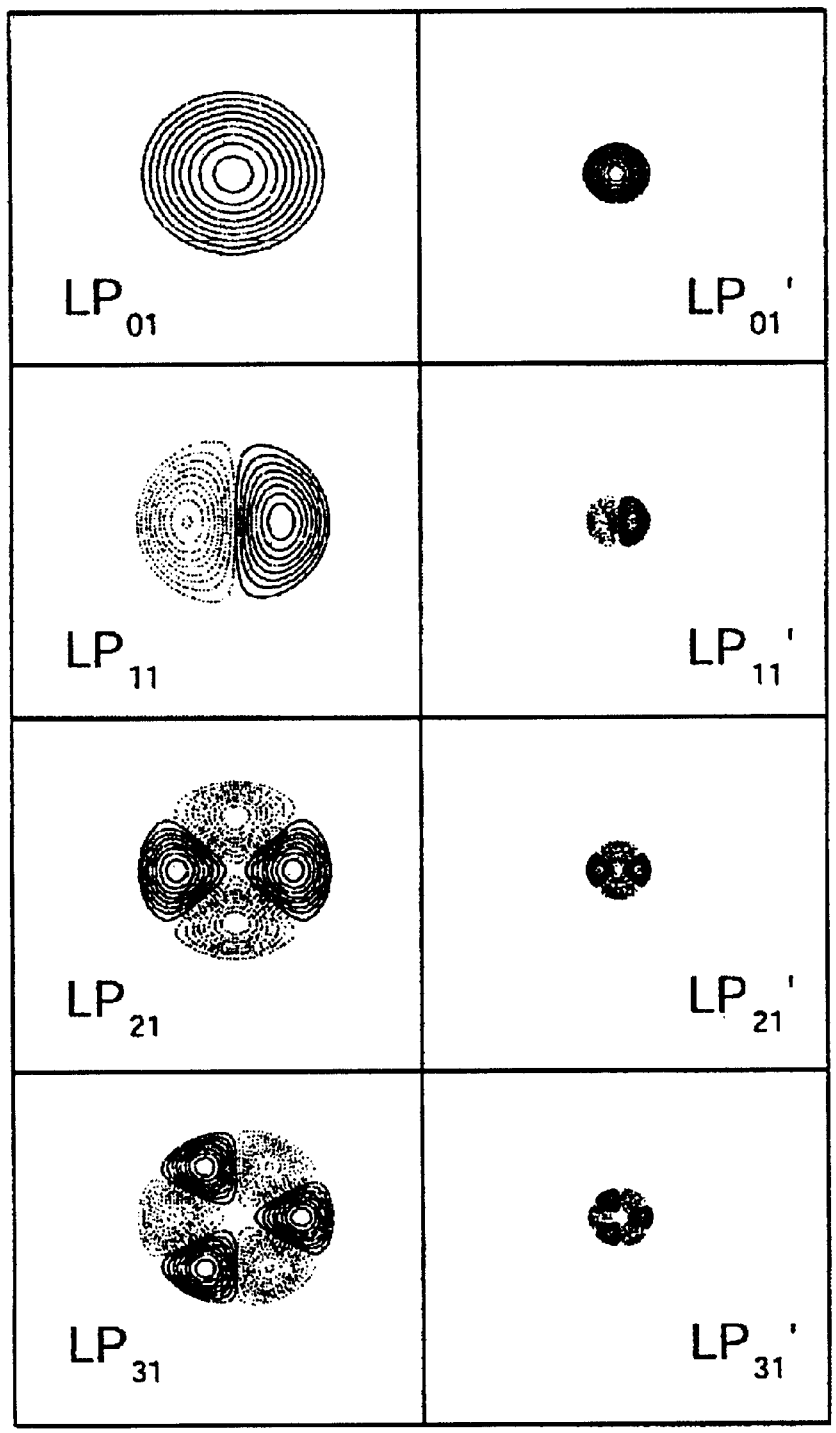
FIG. 5 shows the field profiles of the lowest four original traverse modes and corresponding feedback transverse modes in a VCSEL.

FIG. 5 shows the field profiles of the lowest four original traverse modes and corresponding feedback transverse modes in the VCSEL. In FIG. 5, the dotted lines are 180° out of phase from the solid lines. $LP_{m1}$, where m=1, 2, 3, 4, indicates the original transverse mode corresponding to the field profile $\psi_m(\rho,\phi)$, and $LP'_{m1}$ indicates the feedback transverse mode corresponding to the field profile $\psi'_m(\rho,\phi)$. In particular, $LP_{01}$ (fundamental first order mode), $LP_{11}$ (second order mode), $LP_{21}$ (third order mode), and $LP_{31}$ (fourth order mode) denote the lowest four original transverse modes of the VCSEL, and $LP'_{01}$, $LP'_{11}$, $LP'_{21}$, and $LP'_{31}$ denote the corresponding feedback transverse modes which have reduced in spot sizes due to the optical focusing effect described above. The field profile $\psi'_m(\rho,\phi)$ of the feedback transverse modes $LP'_{01}$, $LP'_{11}$, $LP'_{21}$, and $LP'_{31}$ represents the effective field strength experienced by the active layer 12 having a quantum-well structure. The spot sizes of these feedback transverse modes have been reduced to be smaller than those of the original transverse modes due to the optical focusing effect described above.

It is well known that laser action is such a highly non-linear phenomenon that even a very small amount of light feedback could seriously affect the resultant lasing behavior. Thus, the reduced feedback modes affect the original modes and determine structural preferences between the modes. As a measure of the determination of the structural preferences, the overlap integral between the original mode and the feedback mode is used.

The overlap integral $I_{mm'}$ between the field profile $\psi_m(\rho,\phi)$ of the original modes and the field profile $\psi'_m(\rho,\phi)$ of the feedback transverse modes is expressed as:

$$I_{mm'}=|\int\int\psi_m(\rho,\phi)\psi'_m(\rho,\phi)\rho d\rho d\phi|^2 \qquad (2)$$

Figure 6:
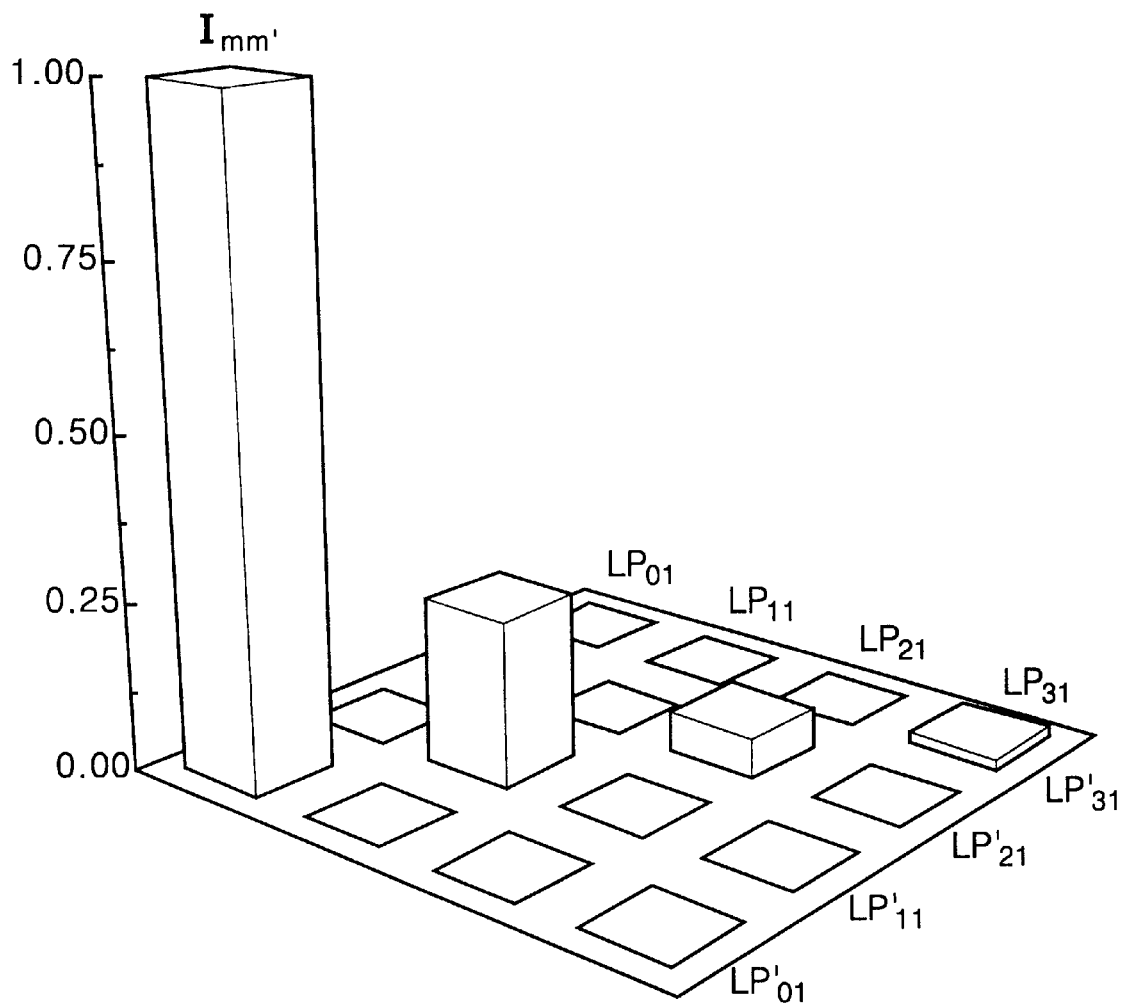
FIG. 6 is a normalized graphical illustration via a 4×4 matrix of the result of numerical calculations of the overlap integral $I_{mm'}$ for all possible combinations between the original mode $LP_{m1}$ and the feedback mode $LP'_{m1}$ using formula (2)

FIG. 6 is a normalized graphical illustration via a 4×4 matrix of the result of numerical calculations of the overlap integral $I_{mm'}$ for all possible combinations between the original mode $LP_{m1}$ and the feedback mode $LP'_{m1}$ using formula (2) above. As shown in FIG. 6, the overlap integral between corresponding mode coefficients appears to be large, whereas the off-diagonal terms between different mode coefficients are practically zero.

As described with reference to FIG. 2 and formula (2) above, according to the example of the model calculation for the VCSEL with the current confinement layer formed by selective oxidation, the fundamental mode is most preferred for the feedback mode than the other higher order modes; approximately 4, 17, 67 times greater than the second order mode, the third order mode, and the fourth order mode, respectively.

In the VCSEL according to the present invention, the fundamental (first order), which has a peak light intensity at its center, is structurally preferred and thus laser oscillation can be locked in the fundamental mode according to the present invention.

Figure 7:
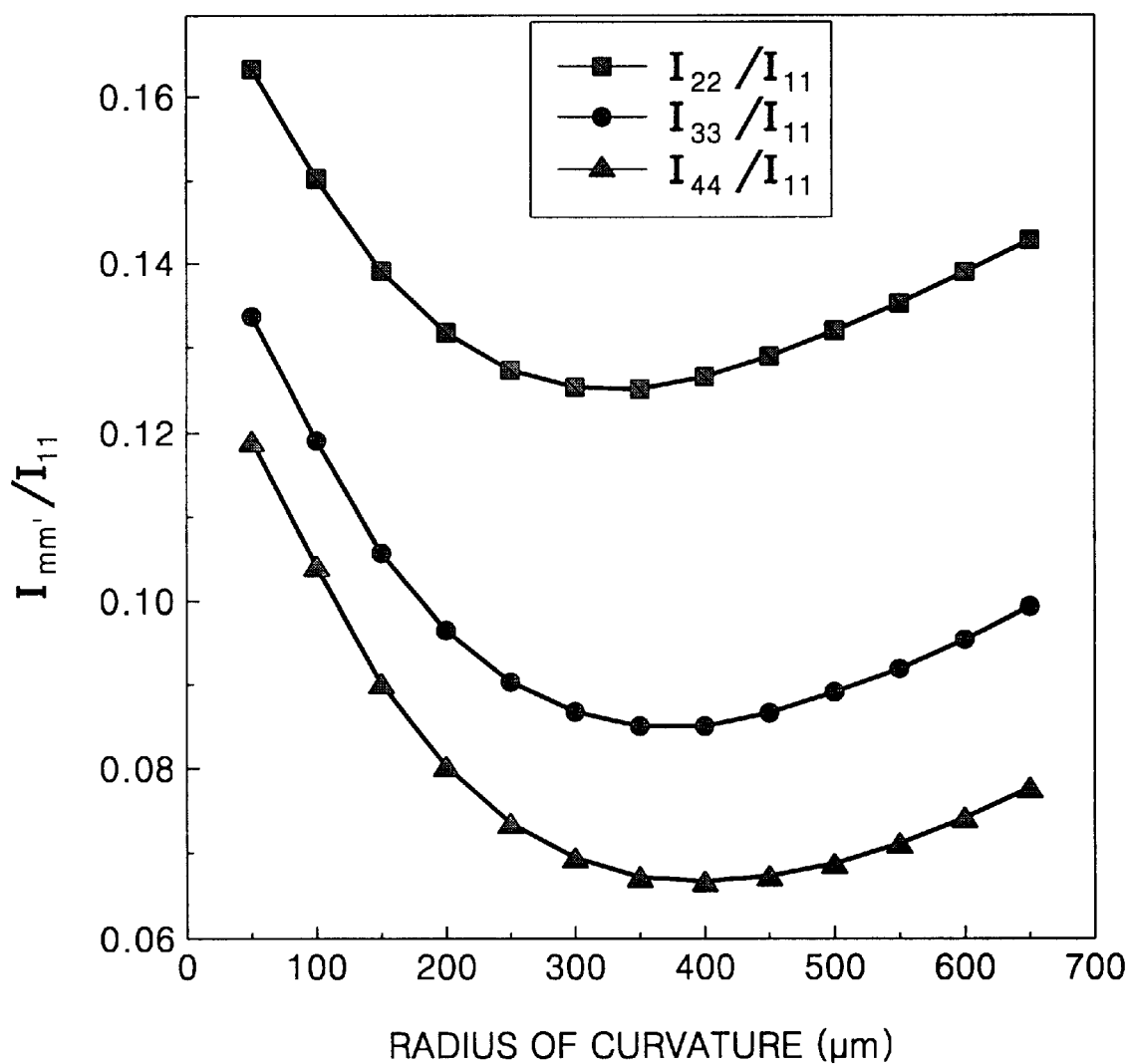
FIG. 7 is a graph of the overlap integrals $I_{22}$, $I_{33}$, and $I_{44}$ for the second order, third order, and fourth order modes, which are normalized with respect to the overlap integral $I_{11}$ for the fundamental mode, with respect to changes in the radius of curvature of a lens surface of a feedback member.

FIG. 7 is a graph of the overlap integrals $I_{22}$, $I_{33}$, and $I_{44}$ for the second order, third order, and fourth order modes, which are normalized with respect to the overlap integral $I_{11}$ for the fundamental mode, with respect to changes in the radius of curvature of the lens surface 150a of the feedback member 150. As shown in FIG. 7, an overlap integral proportion of each of the higher order modes with respect to the fundamental mode varies according to the radius of curvature of the feedback member 150.

Therefore, an optimal radius of curvature of the feedback member 150 at which mode-locking to the fundamental mode most likely occurs while suppressing higher order modes can be calculated using the result of the overlap integral calculation. As is apparent from FIG. 7, when the effective radius of curvature of the feedback member 150 is in the range of from about 200 μm to about 500 μm, for example, about 300 μm, a relative overlap integral for the second order mode with respect to the fundamental mode is minimal, and the fundamental mode is predominantly large over the second order mode. Therefore, the likelihood of laser oscillation at the fundamental mode is greatly enhanced.

In a VCSEL according to the present invention, the radius of curvature of the feedback member 150 is not limited to the range of 200–500 μm and can be varied according to the structure of the VCSEL.

While the VCSEL according to the present invention has been illustrated and described to be a top emitting type for emitting a laser beam through the upper DBR 140 and to have the feedback member 150 on the top of the upper DBR 140, the present invention is not limited to this structure.

In other words, a VCSEL according to the present invention may be constructed of a top emitting type with the feedback member 150 underneath the substrate 100, which locks the laser transverse mode to the fundamental mode. The structures and materials for the upper electrode 150 and the lower electrode 170 may be appropriately varied.

Figure 8:
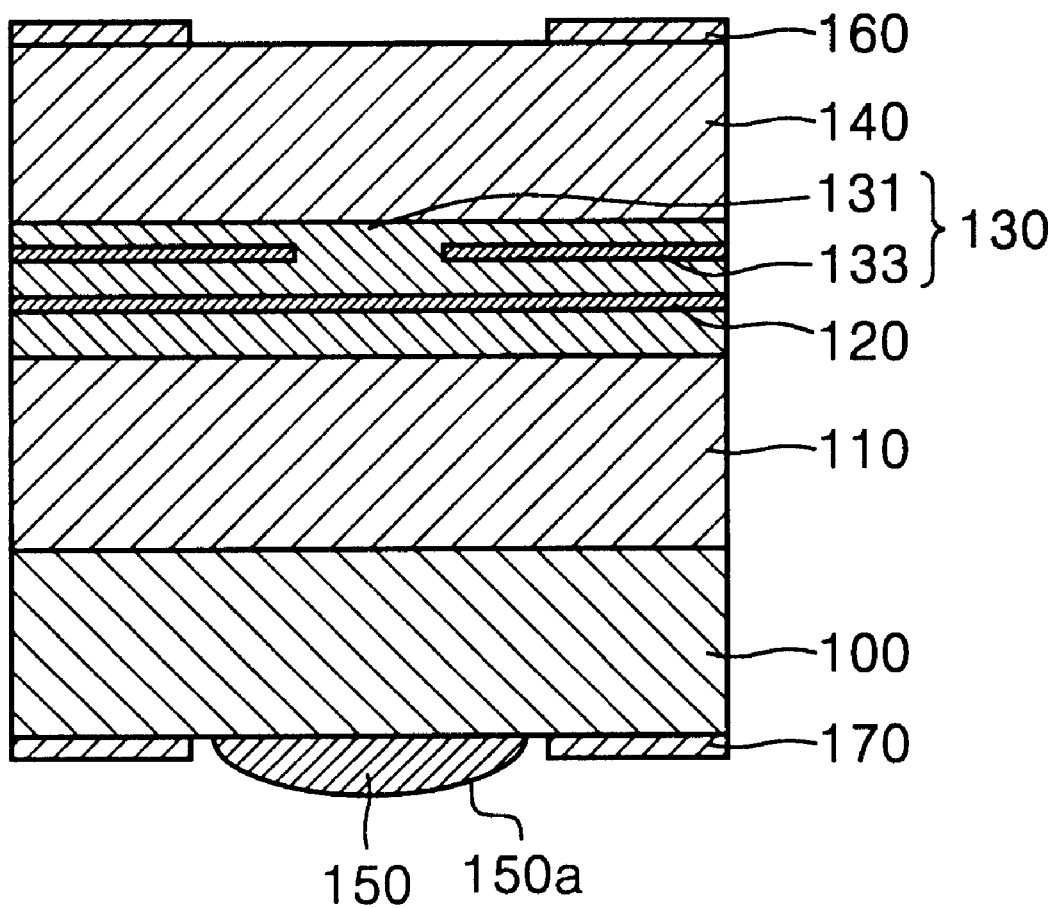
FIG. 8 is a schematic view of another embodiment of the VCSEL according to the present invention.

An alternative VCSEL according to the present invention may be constructed of a bottom emitting type for emitting a laser beam through the substrate 100 with the feedback member 150 for locking the laser transverse mode to the fundamental mode, on the top of the upper DBR 140 or on the bottom of the substrate 100, as shown in FIGS. 2 and 8.

When the feedback member 150 is formed on the bottom of the substrate 100, as shown in FIG. 8, the distance between the active layer 120 and the feedback member 150 increases according to the thickness of the substrate 100, which accompanies structural modifications of, for example, the radius of curvature of the feedback member 150, the size of an aperture, etc., but follows substantially the same principle of mode-locking to the fundamental mode as when the feedback member 150 is formed on the top of the upper DBR 140.

In a VCSEL according to the present invention, at least one of the aperture of oscillation of the VCSEL and the effective diameter and radius of curvature of the feedback member 150 may be increased to be hundreds of micrometers or greater to give a sufficiently large gain area, which contributes to laser oscillation. Such an increased gain area enables high-power oscillation of the fundamental traverse mode. In other words, a VCSEL according to the present invention may be formed to have a structure of a sufficiently large gain area. In this case, the VCSEL according to the present invention can be advantageously manufactured as a high-power laser capable of oscillating the fundamental transverse mode. Here, the aperture of laser oscillation may be the same as, for example, a diameter of the aperture 131 of the current confinement layer 130.

When the aperture of oscillation of the VCSEL or the effective diameter of the feedback member 150 is increased, for example, on the order of hundreds of micrometers, an increase in the gain area where laser oscillation occurs is inevitable. As an example, when the feedback member 150 is positioned underneath the substrate 100, the distance between the resonator and the feedback member 150 structurally increases according to the thickness of the substrate 100. Accordingly, the radius of curvature of the concave mirror increases. Due to the increased radius of curvature of the concave mirror, the Gaussian beam waist slowly decreases, and the Gaussian beam covers a considerable area of the active layer 120. As a result, the gain area becomes large.

To be applied as a high-power laser, as described above, it is preferable that the VCSEL according to the present invention is formed of a gain-guided structure that supports relatively less transverse modes, rather than an index-guided structure.

When the aperture of laser oscillation and the effective diameter of the feedback member 150 are increased to enlarge the aperture of laser beam emission and thus weaken diffraction of the laser beam emitted from the VCSEL according to the present invention, the feedback member 150 reflects a portion of the laser beam output from the resonator and feeds the same back into the resonator and simultaneously acts as a lens for the laser beam proceeding to the outside from the resonator to make it into a condensing beam, diverging beam, or parallel beam.

If the aperture of laser beam emission is too small, the lens' converging power is offset by the diffraction power of oscillating light, so that it is difficult to converge the oscillating light by the lens. In contrast, if the aperture of laser beam emission is large enough to weaken the diffraction power of the oscillating light, the oscillating light can be made into converging light, diverging light, or parallel light by the lens' converging power.

When the VCSEL according to the present invention having a structure with a large laser oscillation aperture and the feedback member of a large diameter is applied for optical communications, there is no need for a converging lens for coupling to an optical fiber. Accordingly, a process of optical-axis alignment between the laser beam emitted from the VCSEL and the converging lens can be omitted.

While the VCSEL according to the present invention has been illustrated and described above as including the feedback member 150 only at one of the top of the upper DBR 140 and the bottom of the substrate 100, it is appreciated that the feedback member 150 for feeding a portion of the output beam back into the resonator can be formed on each of the top of the upper DBR 140 and the bottom of the substrate 120 to construct a VCSEL according to the present invention.

As described above, a VCSEL according to the present invention includes a feedback member acting as a concave mirror by reflecting a portion of the light externally emitted from the resonator to feed it back into the resonator, so that the VCSEL operates predominantly in the single fundamental transverse mode, emitting a laser output having a peak intensity at its center. The VCSEL according to the present invention can be manufactured by a simple process and provides excellent reproducibility, compared to other methods suggested so far.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A vertical cavity surface emitting laser comprising:
   a substrate;
   a first reflector layer formed on a surface of the substrate;
   an active layer formed on the first reflector layer to generate light emission;
   a second reflector layer formed on the active layer, the first and the second reflector layers forming a resonator to generate a laser beam from the light emission; and
   a feedback member formed on at least one of a top surface of the second reflector layer and a bottom surface of the substrate so that the feedback member is positioned to receive the laser beam emitted from the resonator through a respective one of the first and second reflector layers,
   the feedback member serving to reflect and feed a portion of the laser beam emitted from the resonator back into the resonator, the feedback member being formed of a material transparent to the wavelength of the laser beam,
   the respective one of the first and second reflector layers having a reflectivity relatively lower than a reflectivity of the other of the first and second reflector layers.

2. The vertical cavity surface emitting laser of claim 1, wherein the feedback member acts as a concave mirror for the resonator.

3. The vertical cavity surface emitting laser of claim 1, wherein the substrate, the first reflector layer, the active layer and the second reflector layer are constructed of a material based on one selected from the group consisting of GaAs, GaSb, GaN, InP, and ZnSe.

4. The vertical cavity surface emitting laser of claim 1, wherein the feedback member is formed of a semiconductor material which is transparent with respect to the wavelength of the laser oscillation and is capable of lattice matching with a first material of the substrate or a second material of the second reflector layer.

5. The vertical cavity surface emitting laser of claim 1, wherein the feedback member is formed of a material selected from the group consisting of organic and inorganic materials which are transparent with respect to the wavelength of the laser oscillation.

6. The vertical cavity surface emitting laser of claim 1, wherein the feedback member positioned on the top surface of the second reflector layer has an effective radius of curvature ranging from approximately 200 $\mu$m to approximately 500 $\mu$m.

7. The vertical cavity surface emitting laser of claim 1, wherein a gain area for the laser oscillation is increased for high-power oscillation of a fundamental transverse mode by increasing at least one of an aperture of laser oscillation, an effective diameter of the feedback member, and a radius of curvature of the feedback member.

8. The vertical cavity surface emitting laser of claim 1, wherein at least one of an aperture of laser oscillation and an effective diameter of the feedback member is selected to weaken the diffraction power of oscillating light such that the feedback member feeds the portion of the light externally emitted from the resonator back into the resonator by reflecting the same and simultaneously acts as a lens for light proceeding to the outside from the resonator to make it into a converging beam, diverging beam, or parallel beam.

9. The vertical cavity surface emitting laser of claim 1, wherein the laser oscillation is induced by current injection.

10. The vertical cavity surface emitting laser of claim 9, further comprising a current confinement structure which is formed by selective oxidation or ion implantation and confines flow of current.

11. The vertical cavity surface emitting laser of claim 1, wherein the laser oscillation is induced by optical pumping of external light.

12. The vertical cavity surface emitting laser of claim 2, wherein the feedback member is positioned on the top surface of the second reflector layer and has an effective radius of curvature ranging from approximately 200 $\mu$m to approximately 500 $\mu$m.

13. The vertical cavity surface emitting laser of claim 2, wherein a gain area for the laser oscillation is selected for high-power oscillation of a fundamental transverse mode by increasing at least one of an aperture of laser oscillation, an effective diameter of the feedback member, and a radius of curvature of the feedback member.

14. The vertical cavity surface emitting laser of claim 2, wherein at least one of an aperture of laser oscillation and an effective diameter of the feedback member is selected to reduce the diffraction power of oscillating light such that the feedback member feeds the portion of the light externally emitted from the resonator back into the resonator by reflecting the same and simultaneously acts as a lens for light proceeding to the outside from the resonator to make it into a converging beam, diverging beam, or parallel beam.

15. The vertical cavity surface emitting laser of claim 2, wherein the laser oscillation is induced by current injection.

16. The vertical cavity surface emitting laser of claim 2, further comprising a current confinement structure which is formed by selective oxidation or ion implantation and confines flow of current.

17. The vertical cavity surface emitting laser of claim 2, wherein the laser oscillation is induced by optical pumping of external light.

* * * * *